United States Patent [19]

Folk

[11] Patent Number: 4,616,250

[45] Date of Patent: Oct. 7, 1986

[54] CONTACT ASSEMBLY FOR SMALL SEMICONDUCTOR DEVICE

[75] Inventor: Lee E. Folk, Phoenix, Ariz.

[73] Assignee: Motorola, Inc., Schaumburg, Ill.

[21] Appl. No.: 689,546

[22] Filed: Jan. 7, 1985

Related U.S. Application Data

[63] Continuation-in-part of Ser. No. 627,712, Jul. 3, 1984, abandoned.

[51] Int. Cl.[4] .............................................. H01L 23/48
[52] U.S. Cl. ......................................... 357/70; 357/68
[58] Field of Search ............................... 357/70, 68, 65

[56] References Cited

U.S. PATENT DOCUMENTS 3,500,136  3/1970  Fischer ................................... 357/70
3,569,797  3/1971  Simmons .......................... 357/70 X
3,577,633  5/1971  Homma ............................ 357/70 X
4,346,396  8/1982  Carroll, II et al. ................... 357/70

FOREIGN PATENT DOCUMENTS 57-190340  11/1982  Japan ..................................... 357/70

Primary Examiner—Martin H. Edlow
Assistant Examiner—Sara W. Crane
Attorney, Agent, or Firm—Vincent B. Ingrassia

[57] ABSTRACT

A resilient contact assembly for contacting a semiconductor device comprises a center segment and first and second side segments. The center segment has an open-ended pocket in the end thereof for receiving, positioning and supporting the semiconductor device. The ends of the side segment are bent out of the plane of the center segment and first and second contact arms extend therefrom towards said pocket to contact the semiconductor device.

5 Claims, 5 Drawing Figures

CONTACT ASSEMBLY FOR SMALL SEMICONDUCTOR DEVICE

CROSS REFERENCE TO RELATED APPLICATIONS

This is a continuation-in-part of application Ser. No. 627,712 filed July 3, 1984 and entitled "CONTACT ASSEMBLY FOR SMALL SEMICONDUCTOR DEVICE", now abandoned.

BACKGROUND OF THE INVENTION

This invention relates generally to contact assemblies for small semiconductor devices and, more particularly, to a contact assembly for receiving, positioning, supporting, and contacting the semiconductor device without requiring separate die bonding and wire bonding steps.

Techniques for mounting, contacting and encapsulating small semiconductor devices such as diodes, transistors, thyristors, etc. are well known. In the past, such techniques have required wire bonding the contact regions of the device to a lead frame. Gold or aluminum wires are secured to the metalized surfaces of the device under compression and heat. These wires are generally very small in diameter (typically 0.5 mil–20 mil) and therefore, the equipment necessary to accomplish the bond is generally complex and expensive. Furthermore, due to the intricacy of the process, a great deal of time is required to reach the end result.

To overcome these problems, contact assemblies have been developed which inherently support the semiconductor device and at the same time resiliently engage the contact regions of the device such that the bonding of the device to the support and the joining of contacts to the metalized contact regions on the device may be accomplished in a single reflow step. Such a technique is taught in U.S. Pat. No. 3,500,136 entitled "CONTACT STRUCTURE FOR SMALL AREA CONTACT DEVICES" issued on Mar. 10, 1970. This patent describes an elongated contact spring which may be presented in a ladder lead frame format, wherein each spring is transversly segmented into a plurality of parallel segments. That is, each contact assembly consists of three separate segments which are deflectable with respect to each other. A semiconductor device is placed on the center segment and deflected with respect to the side segments such that internally projecting tangs from the sides of the outer two segments are pressed into engagement with electrodes on the upper surface of the semiconductor device. The lead frame assembly including a plurality of individual contact assemblies is then placed in a furnace and the semiconductor dies are soldered to their respective contacts. The semiconductor device portion may then be encapsulated and the groups of three segments for each device separated from segments associated with other devices.

Unfortunately, the apparatus described in the above referred to U.S. patent suffers several disadvantages. First, the tangs which form parts of the side segments of each contact assembly are stamped out of that portion of the center segment upon which the semiconductor device rests. Therefore, the semiconductor device is not entirely supported from beneath. The regions of non-support correspond to the regions of maximum pressure on the device since these regions correspond to the tangs engaging the upper surface of the semiconductor device. Additionally, the heat sinking capability of the center segment is substantially reduced.

One apparatus which partially solves the above problem is shown and described in U.S. Pat. No. 3,569,797 issued Mar. 9, 1971 and entitled "Semiconductor Device with Preassembled Mounting". In this device, the leads are formed to provide spring contact with an active element and also serve as an inserting and positioning fixture. The disclosed stamped lead frame includes a tab from which emitter, collector and base leads extend. The collector lead terminates in a rectangular mounting platform. The emitter and base leads terminate in backward and inward extending contact sections which provide spring pressure on the platform. A semiconductor device is then placed on the platform by deflecting either the platform or the emitter and base leads and then allowing the contact sections to come to rest on the device.

The above described device suffers certain disadvantages. First, the deflection of the leads in order to insert a semiconductor device on the platform may damage the leads. Second, it is difficult to position the semiconductor device on the platform for proper contact.

It is known, for example, to provide a pocket or seat on a base or substrate in order to properly position a semiconductor device for contact by a four-sided pocket for this purpose is shown in U.S. Pat. No. 4,346,396 issued Aug. 24, 1982 entitled "Electronic Device Assembly and Methods of Making Same". However, the use of such a pocket in the device of the apparatus of U.S. Pat. No. 3,569,797 would still require significant deflection of the leads. In addition to the above referred to disadvantages, there is no means for properly positioning the semiconductor device on the center segment to assure that the contact tangs of the side segments accurately engage the metalized contact regions. Therefore, additional time and effort must be consumed in order to achieve proper positioning prior to commencing the solder reflow step.

SUMMARY OF THE INVENTION

It is an object of the present invention to provide an improved contact assembly for semiconductor devices.

It is a further object of the present invention to provide an improved contact assembly for semiconductor devices which may be presented in a ladder lead frame format in which the inherent resiliency of each contact assembly is utilized in conjunction with a positioning pocket on the assembly to secure the device prior to permanent attachement.

It is a still further object of the present invention to provide a contact assembly for small semiconductor devices which provides both vertical and lateral support to the device so as to prevent cracking of the device.

According to a broad aspect of the invention there is provided a resilient contact assembly for making contact through electrodes on the upper or lower surfaces of a semiconductor device, comprising a center segment having an open-ended pocket at one end thereof for receiving, positioning and supporting said semiconductor device first and second segments adjacent opposite sides of said central segment, the ends of said first and second segments approximate said pocket being bent out of the plane of said center segment and first and second contact arms extending from the ends of said first and second segments toward said pocket.

DESCRIPTION OF THE PREFERRED EMBODIMENT

Figure 1A:
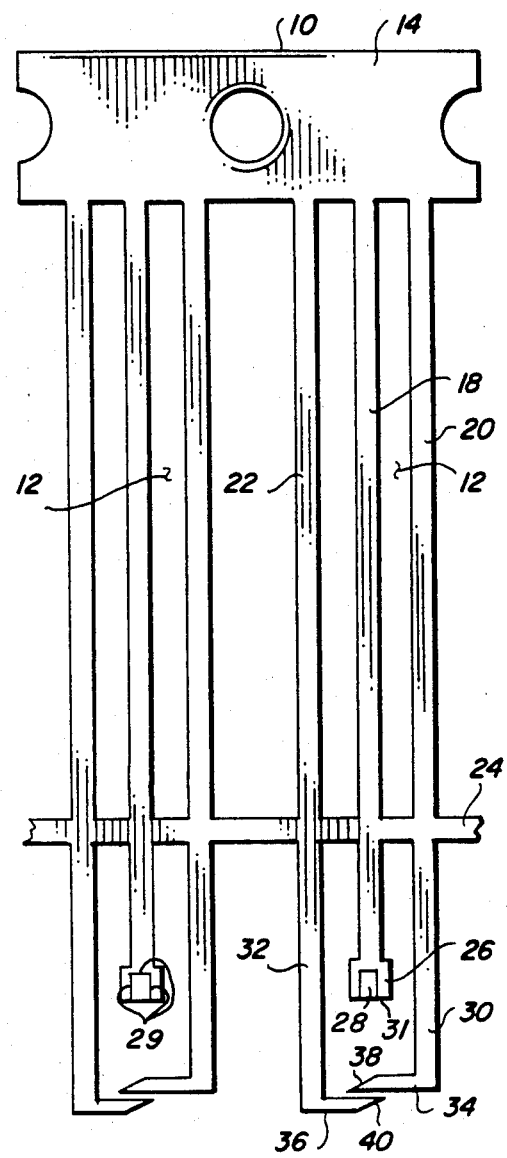
FIGS. 1A and 1B are plan and side views of a ladder leadframe assembly including a plurality of three pronged contact assemblies structured in accordance with the present invention at a preliminary stage of manufacture.
Figure 1B:
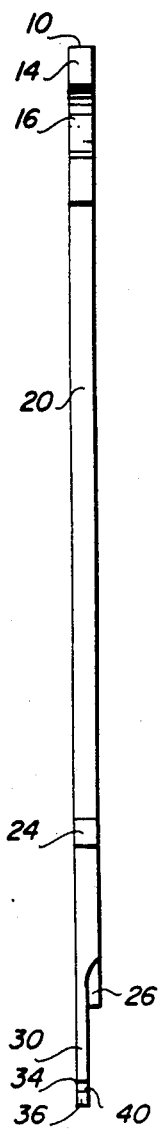

Referring to FIGS. 1A and 1B, a ladder leadframe 10 includes plurality of contact assemblies 12 connected to a connecting band 14 having a plurality of indexing holes 16 therethrough. Each contact assembly includes a center segment 18 and first and second side segments 20 and 22 respectively joined at one end thereof by connecting band 14 and at an intermediate point by tie bar 24.

Center segment 18 terminates with a widened rectangular portion 26 having an open-ended pocket 28 therein. This pocket may be rectangular in shape and has a depth of two to three mils. It is used to position the semiconductor device placed therein and provides both lateral and vertical support therefore. It should be noted that since pocket 28 is open-ended (i.e. has only three sides 29 and is open along the front edge 31 of rectangular portion 26) the amount of deflection of center segment 18 with respect to side segment 20 and 22 in order to insert a semiconductor device is minimized.

Both side segments 20 and 22 include extensions 30 and 32 respectively which are somewhat thinner than side segments 20 and 22 as is shown in FIG. 1b so as to facilitate bending which would place the contact assembly in its final form as will be described below. These segments are turned inward at right angles as is shown at 34 and 36. The inwardly directed segments each terminate in a tapered point 38 and 40 respectively.

Figure 2A:
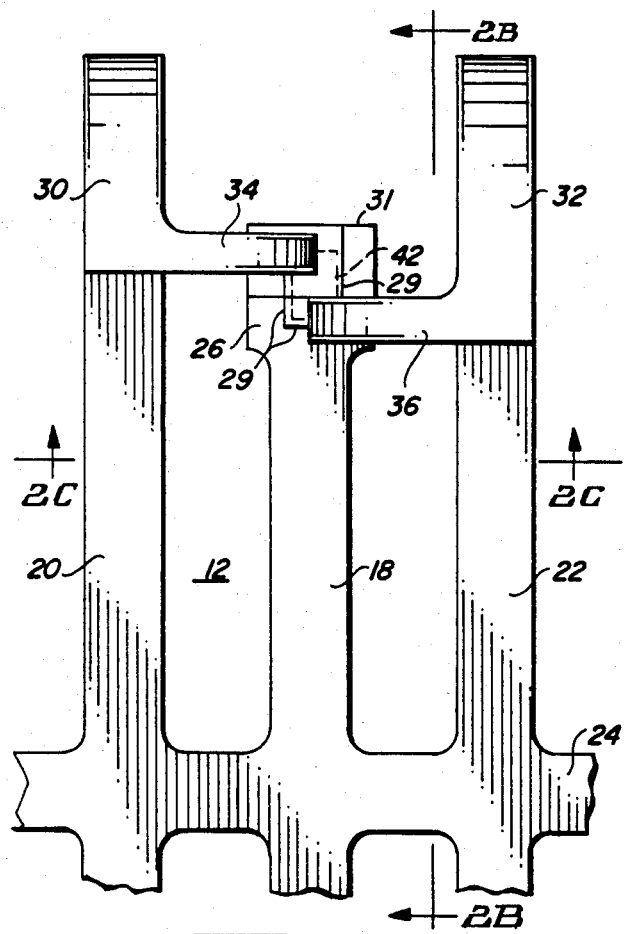
FIGS. 2A and 2B and 2C are plan, side and end views of an individual contact assembly in accordance with the teachings of the present invention.
Figure 2B:
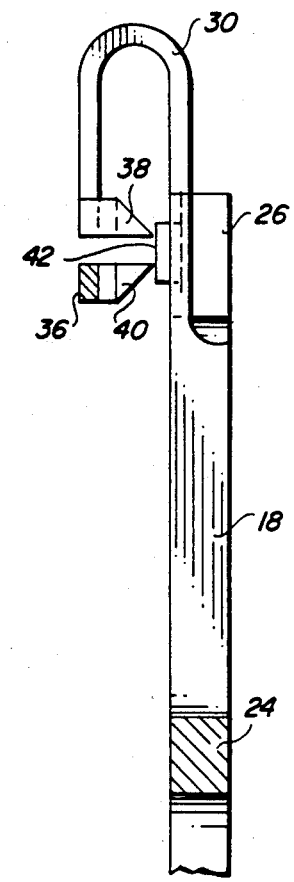
Figure 2C:
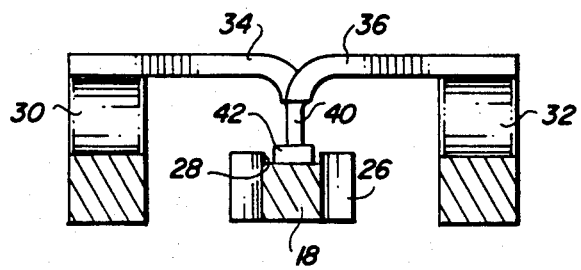

Referring now to FIGS. 2A, 2B and 2C, it can be seen that end portions 30 and 32 of side segments 20 and 22 respectively are bent back approximately 180 degrees and that the end portions of segments 34 and 36 are bent downwards approximately 90 degrees towards pocket 28. It should be clear that the tips of points 38 and 40 may be positioned at any desired distance above pocket 28 by properly choosing the lengths of segments 34 and 36 or the degree of bending of segments 30 and 32 or a combination of both.

In order to contact a semiconductor device 42, center segment 18 is slightly depressed with respect to side segments 20 and 22 and the device slid in pocket 28. The contact assembly is made of copper, steel or any other structure which offers the required strength and resiliency such that center segment 18 attempts to return to the plane of side segments 20 and 22. This will cause the apexes of points 38 and 40 to engage metalized contact regions (not shown) on the upper surface of device 42. Since the contact regions on the upper or lower surface of the die and the contact assembly have been presoldered, it is only then necessary to place the assembly including the semiconductor device in a reflow furnace to complete the contacting process. The device and contact leads may then be encapsulated using well known techniques.

In summary, the inventive contact assembly offers the advantages of providing complete vertical and lateral support to the semiconductor device so as to minimize the possibility of cracking. Furthermore, the pocket positions the semiconductor device so as to significantly reduce the possibility of inaccurate contacting the semiconductor device.

The above description is given by way of example only. Changes in form and details may be made by one skilled in the art without the parting from the scope of the invention as defined by the appended claims.

I claim:

1. A resilient contact assembly for making contact through electrodes on the upper or lower surfaces of a semiconductor device, comprising:

a center segment having an open-ended pocket at one end thereof for receiving, positioning and supporting said semiconductor device;

first and second segments adjacent opposite sides of said central segment, the ends of said first and second segments approximate said pocket being bent out of the plane of said center segment; and first and second contact arms extending from the ends of said first and second segments toward said pocket.

2. The resilient contact assembly according to claim 1 further comprising a plurality of groups of said center and side segments, each of said groups formed in a common elongated sheet of resilient metal, and laterally disposed with respect to one another and joined by a common connector.

3. A resilient contact assembly according to claim 1 wherein said first and second segments are longer than said center segment and the ends of said first and second segments are bent upward and generally back towards said pocket.

4. A resilient contact assembly according to claim 3 wherein said first and second contact arms terminate with a point for contacting the upper surface of said device.

5. A resilient contact assembly according to claim 4 wherein the tips of said points reside at a predetermined distance above the plane of said center segment.

* * * * *